United States Patent [19]

Morishita

[11] Patent Number: 5,412,243
[45] Date of Patent: May 2, 1995

[54] PHOTOELECTRIC CONVERSION APPARATUS

[75] Inventor: Masakazu Morishita, Atsugi, Japan

[73] Assignee: Canon Kabushiki Kaisha, Tokyo, Japan

[21] Appl. No.: 974,348

[22] Filed: Nov. 10, 1992

Related U.S. Application Data

[63] Continuation of Ser. No. 656,590, Feb. 19, 1991, abandoned, which is a continuation of Ser. No. 271,313, Nov. 15, 1988, abandoned.

[30] Foreign Application Priority Data

Nov. 18, 1987 [JP] Japan ................. 62-289461

[51] Int. Cl.⁶ .............. H01L 29/68; H01L 29/78; H01L 27/14; H01L 31/00
[52] U.S. Cl. .............................. 257/462; 257/461
[58] Field of Search .............. 357/54, 23.8; 257/461, 257/462

[56] References Cited

U.S. PATENT DOCUMENTS

| | | | |
|---|---|---|---|
| 4,508,749 | 4/1985 | Brannon et al. | 427/43.1 |
| 4,519,128 | 5/1985 | Chesebro et al. | 29/576 W |
| 4,651,184 | 3/1987 | Malhi | 357/23.6 |
| 4,680,614 | 7/1987 | Beyer et al. | 357/50 |
| 4,751,558 | 6/1988 | Kenney | 357/23.6 |
| 4,763,181 | 8/1988 | Tasch, Jr. | 357/23.6 |
| 4,786,954 | 11/1988 | Morie et al. | 357/23.6 |
| 4,795,722 | 1/1989 | Welch et al. | 437/192 |

FOREIGN PATENT DOCUMENTS 53-068987  6/1978  Japan .................. 357/23.8

OTHER PUBLICATIONS

Esnamlt et al, 'Self-Aligned [IGFCT[', IBM Tech, vol. 16 #5, Oct. 73.
R. Muller & T. Kamins, Device Electronics for Integrated Circuits, 1986, pp. 452–454, 257–262, 463.

Primary Examiner—Jerome Jackson
Assistant Examiner—Stephen D. Meier
Attorney, Agent, or Firm—Fitzpatrick, Cella, Harper & Scinto

[57] ABSTRACT

A photoelectric conversion apparatus having a semiconductor area of a first type and a plurality of semiconductor areas of a second type for storing carriers produced by optical excitation. Adjacent semiconductor areas of the second type are used as main electrode areas, and a portion of the semiconductor area of the first type between the adjacent semiconductor areas of the second type is used as a channel area to form an insulated gate type transistor. The channel area is formed as deep as or deeper than the adjacent semiconductor areas of the second type, and is of higher impurity density than the semiconductor area of the first type and lower impurity density than the semiconductor areas of the second type.

36 Claims, 5 Drawing Sheets

PHOTOELECTRIC CONVERSION APPARATUS

This application is a continuation of application Ser. No. 07/656,590, filed Feb. 19, 1991, now abandoned, which is a continuation application of Ser. No. 07/271,313 filed Nov. 15, 1988, abandoned.

BACKGROUND OF THE INVENTION

1. Field of the Invention

The present invention relates to photoelectric conversion apparatus of the type which stores carriers produced by optical excitation.

2. Related Background Art

Figure 1A:
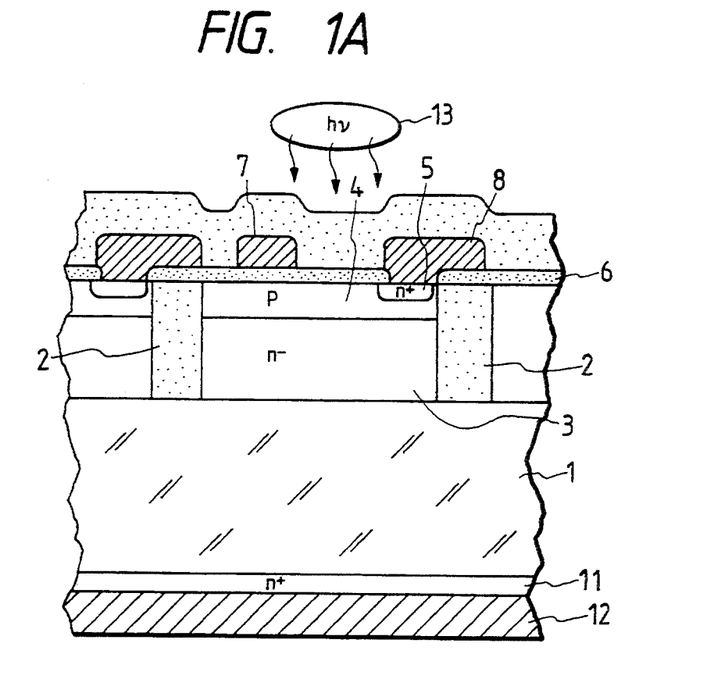
FIG. 1A is a schematic cross section view of an example of a photoelectric conversion cell disclosed in U.S. Pat. NO. 4,686,554.
Figure 1B:
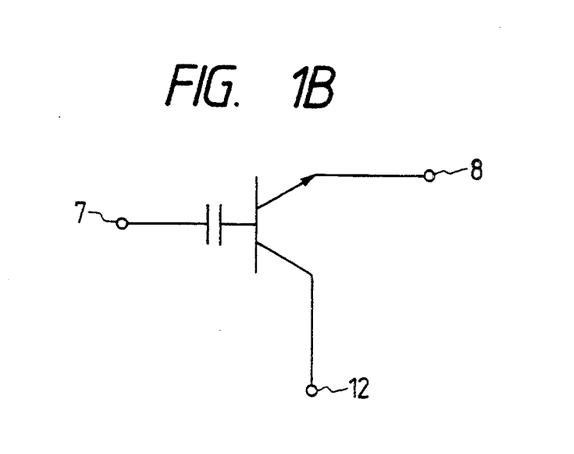
FIG. 1B is an equivalent circuit diagram of a photoelectric conversion cell of the apparatus.

FIG. 1A is a schematic cross section view of an example of photoelectric conversion cell disclosed in U.S. Pat. No. 4,686,554 (EP 0132076). FIG. 1B is an equivalent circuit diagram of the photoelectric conversion cell.

In FIGS. 1A and 1B, a plurality of photoelectric conversion cells are formed and arranged on an n-silicon substrate 1 and separated electrically from adjacent cells by element separating areas 2 made of $SiO_2$, $Si_3N_4$ or polysilicon.

Each cell has the following structure. A p-area 4 is formed by doping p-type impurities into an $n^-$-area 3 of low impurity density formed using epitaxial techniques or the like An $N^+$-area 5 is formed in the p-area 4 by impurity diffusion or ion implantation. The p-area 4 and $n^+$-area 5 are the base and emitter, respectively, of a bipolar transistor.

An oxide film 6 is formed as an insulating layer on the $n^-$-area 3 on which those areas are formed and a capacitor electrode 7 with a predetermined area is formed on the oxide film 6. The capacitor electrode 7 opposes the p-base area 4 having the oxide film 6 therebetween and the potential of the floated p-base area 4 is controlled by a pulse voltage applied to the capacitor electrode 7.

Furthermore, an emitter electrode 8 connected to the $n^+$-emitter area 5, an $n^+$-area 11 of high impurity density provided on the back of the substrate 1, and a collector electrode 12 through which a potential is applied to the collector of the bipolar transistor are formed.

The basic operation of the cell as shown in FIGS. 1A and 1B will now be described. First, assume that the p-base area 4 of the bipolar transistor is at an initial negative potential. Light 13 enters the cell from the side of the p-base area 4, positive holes of electron-positive hole pairs generated by the incident light are stored in the p-base area 4, and increases the potential of the p-base area 4 in the positive direction (storage operation).

Subsequently, a positive read voltage pulse is applied to the capacitor electrode 7 to thereby cause the floating emitter electrode 8 to output a read signal corresponding to a change in the base potential in the storage operation (reading operation). Since the quantity of electrical charges stored in the p-base areas 4 does not substantially decrease, repetition of the reading operation is possible.

In order to eliminate positive holes stored in the p-base area 4, the emitter electrode 8 is grounded and a positive refresh pulse voltage is applied to the capacitor electrode 7. By application of this pulse, the p-area 4 is biased forwardly relative to the $n^+$-emitter area 5 to thereby eliminate the positive holes stored therein. When the refresh pulse falls, the p-base area 4 is restored to its initial state (refresh operation). Subsequently, store, read and refresh operations are repeated in a similar manner.

In summary, according to the above described photoelectric conversion method, the carriers produced by the incident light are stored in the p-base area 4 and the quantity of electric charges of the carriers controls the electric current flowing between the emitter electrode 8 and collector electrode 12. Thus, the stored carriers are amplified by the amplifying function of each cell and read to thereby achieve high output, high sensitivity and low noise.

The potential $V_p$ produced at the base due to the carriers (here, holes) stored therein by optical excitation are given by Q/C where Q is the quantity of electric charges of holes stored in the base and C is a capacitance connected to the base. As will be obvious from this expression, high integration results in reduced cell size, Q and C, so that the potential $V_p$ produced by optical excitation is maintained substantially constant. Therefore, the proposed system could be advantageous for achieving high resolution in the future.

However, in this conventional apparatus, the refresh operation to nullify the carriers stored in the base relies on the forward current flowing between the emitter and base. Thus, due to the use of a short-time refresh pulse the base potential after the refresh operation depends on the base potential before the refresh operation, which is a possible cause of a problem of afterglow and a nonlinear photoelectric conversion characteristic.

It is desirable that since the capacitor electrode 7 acts as a light screening area, the area of the capacitor electrode which receives light should be reduced as much as possible to thereby improve a proportion of an opening.

SUMMARY OF THE INVENTION

It is an object of the present invention to solve problems with the refreshing of the stored carriers in a photoelectric conversion apparatus.

It is another object of the present invention to improve a proportion of an opening in a photoelectric conversion apparatus to thereby achieve a high density light-receiving area.

In order to achieve the above objects, according to the present invention, there is provided a photoelectric conversion apparatus comprising:
- a plurality of semiconductor areas of the opposite conductive type formed, in a semiconductor area of one conductive type, for storing therein carriers produced by optical excitation;
- adjacent ones of the semiconductor areas of the opposite conductive type being each used as a main electrode area, a portion of the semiconductor area of the one conductive type between the adjacent ones of the semiconductor areas of the opposite conductive type being used as a channel area to thereby form an insulated gate type transistor; and
- the channel area being formed as deep as or deeper than the adjacent semiconductor areas of the opposite conductive type, the channel area being higher in impurity density than the semiconductor areas of the one conductive type, and lower than the adjacent semiconductor areas of the opposite type.

Still another object of the present invention is to provide a photoelectric conversion apparatus comprising:
- plurality of first semiconductor transistor having two main electrode regions of one conductivity type semiconductor and control electrode regions of opposite conductivity type semiconductor which can store carrier generated by photoexcitement; and a second semiconductor transistor a channel region of the one conductivity type semiconductor provided on said control electrodes, an electrode provided at least via an insulating layer over a zone between said control electrode regions, and plurality of said control electrode regions;

wherein said channel region has an impurity concentration higher than that of said main electrode region adjacent to the channel region, and has a depth as great as or greater than a depth of said control electrode.

DESCRIPTION OF THE PREFERRED EMBODIMENT

According to the present invention achieving the above described object, if the insulated gate type transistor is turned on, the potential of the semiconductor area of each cell is set at a substantially constant potential irrespective of the quantity of stored carriers. If the insulated gate transistor is turned off, the respective cells can be separated electrically from each other.

By arrangement of the channel area, the channel in the insulated gate type transistor is reduced to thereby improve the proportion of an opening and achieve a high density light receiving area.

Preferable embodiments of the present invention will now be described in detail with respect to the drawings.

Figure 2A:
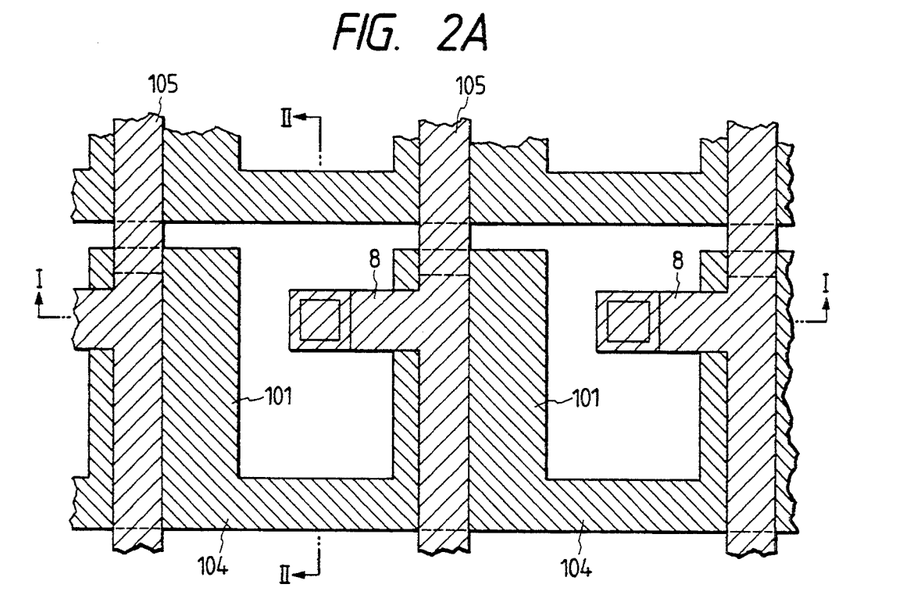
FIG. 2A is a schematic plan view of one embodiment of a photoelectric conversion apparatus according to the present invention.
Figure 2B:
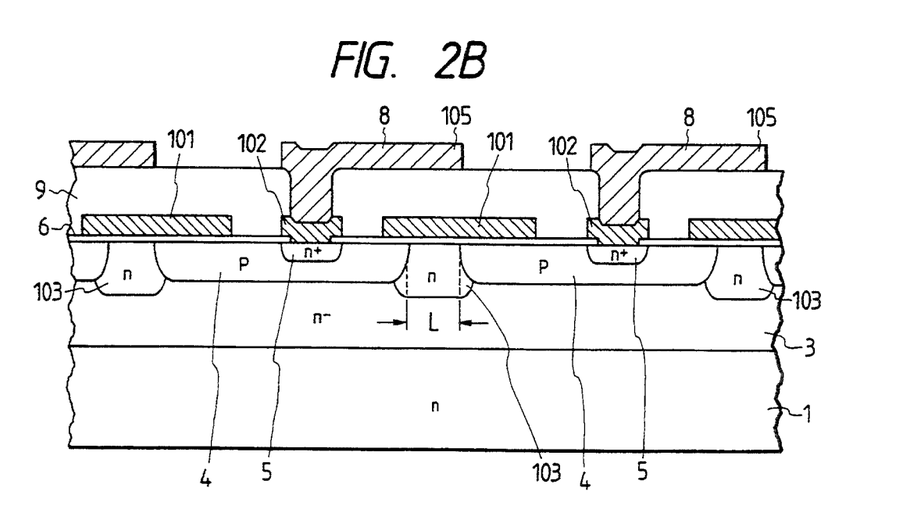
FIG. 2B is a cross-section view taken along the line I—I in FIG. 2A.
Figure 2C:
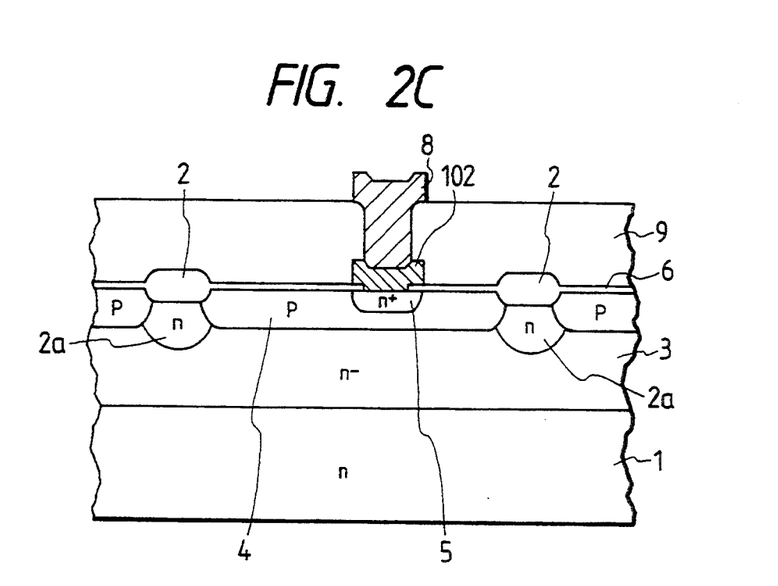
FIG. 2C is a cross-section view taken along the line II—II in FIG. 2A.

FIG. 2A is a schematic plan view of a preferable first embodiment of a photoelectric conversion apparatus according to the present invention, FIG. 2B is the schematic cross-section view of photoelectric conversion apparatus taken along the line I—I in FIG. 2A, and FIG. 2C is a schematic cross-section view of photoelectric conversion apparatus taken along the line II—II in FIG. 2A. The same reference numerals are used to denote parts having similar functions throughout the Figures of the drawings.

In FIGS. 2A-2C, a substrate 1 is a silicon substrate of n-type, n+-type formed by doping impurities such as P, Sp or as, or p-type formed by doping B or the like. For the sake of convenience of explanation of the embodiment, substrate 1 is n-type.

An n+-area 3 as a collector area is formed on the substrate 1 by epitaxial growth, and p-base areas 4 of photoelectric conversion cells are formed on the n−-area 3 at regular intervals using impurity diffusion or ion implantation techniques. An n+-emitter area 5 is formed in each p-base area 4 to thereby form a bipolar transistor from a solid phase or a gaseous phase using impurity diffusion or ion implantation techniques.

As shown in a vertical cross-section in FIG. 2C, the bipolar transistor is electrically separated by element separating areas each including a thick oxide film 2 and a channel stop 2a. The element separation may be performed by n+-areas and trenches.

Each of electrodes 101, which are extensions of electrodes 104, is formed so as to span adjacent p-base areas 4 with the corresponding oxide film 6 between that electrode and p-base areas 4.

Each electrode 101 on the corresponding p-base area 4, as shown in FIG. 2B opposes the adjacent p-base areas 4 to form a capacitor Cox to control the base potential.

A p-channel MOS transistor (hereinafter referred to as "PMOS") is constituted by the electrode 101 as the gate electrode, adjacent p-base areas 4 as the source and drain areas thereof and a channel area 103 provided between the source and drain areas.

In this particular embodiment, the capacitor electrode and the gate electrode of PMOS are connected. The electrode 101 is made of polysilicon, high melting point metal, silicide or polyside (i.e. a two-layer-structure comprising a polysilicon layer and a silicide layer formed on the polysilicon layer).

The channel area 103 of PMOS is of a higher density than the n−-area 3 and formed so as to extend deep compared to the p-base area 4.

PMOS is of p-channel type and normally off-type and is off when the electrode 101 is at ground level or at positive potential. Therefore, the p-base areas 4 between adjacent cells are electrically separated from each other so that it is not necessary to form element-separating areas as is the case in the prior art. This is as much advantageous for fining elements.

In contrast, when the electrode 101 is at a negative potential which exceeds a threshold potential Vth, PMOS is on and the p-base areas 4 of the respective cells are put in a mutually conductive state.

If the base plate 1 is made of p-type silicon, an embedded layer in which at least the sensor section is of n+-type may be provided between the base plate 1 and n−-area 3.

Figure 3A:
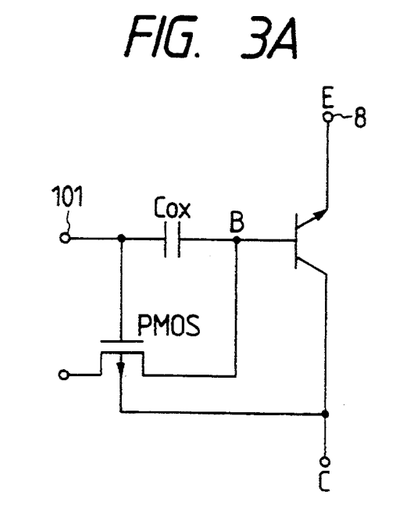
FIG. 3A is a circuit diagram of a single cell in the particular embodiment.
Figure 3B:
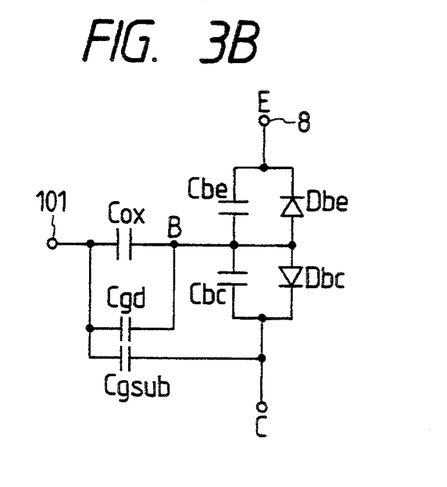
FIG. 3B is an equivalent circuit diagram of the cell wherein its PMOS is off.

FIG. 3A is a circuit diagram of a single cell in the particular embodiment, and FIG. 3B is an equivalent circuit diagram of the cell in which PMOS is off.

A quantity of carriers Qsig stored in the p-base area 4 by incident light produces a storage voltage Vsig given by $$V_{sig} = Q_{sig}/C_{tot}$$

where Ctot is the overall capacitance of the sensor given by $$C_{tot} = C_{ox} + C_{gd} + C_{be} + C_{bc} \cdot C_{gsub}/(C_{bc} + C_{gsub})$$

Therefore, Ctot must be reduced in order to increase the storage voltage Vsig.

Cbe and Cbc of the Ctot are determined by the design of the impurity density. Usually, the impurity densities of the respective areas are determined as follows:

$10^{13}$–$10^{15}$ cm$^{-3}$ for n$^-$-area 3, $10^{16}$–$10^{19}$ cm$^{-3}$ for p-base area 4, and $10^{19}$–$10^{21}$ cm$^{-3}$ for n$^+$-emitter area 5.

Cox is determined by the area of the electrode 101 and the thickness of the oxide film 6, and the value of Cox itself is determined by the voltage applied to the electrode 101.

The gate length of PMOS is preferably short from a standpoint of high density and improvements to the proportion of an opening.

If the n$^-$-area 3 of low impurity density is used intactly as the channel section, leakage would occur due to short channel effect to thereby cause a smear and deteriorate the image quality.

In order to avoid them in the particular embodiment, a channel area 103 shown below is formed in the channel section of PMOS to thereby reduce the short channel effect and achieve shortening of the channel.

The channel area 103 is set higher in impurity density than the n$^-$-area 3 and lower than the p-base area 4. It is $10^{15}$ cm$^{-3}$ in the particular embodiment.

The channel area 103 is formed deeper than the p-base areas 4 joined thereto.

More specifically, assume that the impurity density of the n$^-$-area 3 is of the order of $2 \times 10^{14}$ cm$^{-3}$. So long as the impurity density of the area 3 is maintained as it is, the channel length L (FIG. 2B) can be reduced only to about 3 μm. If the length L is shorter than 3 μm, short channel effect would occur, the threshold voltage Vth of PMOS is lowered, punch-through will occur between the source and drain of PMOS to thereby reduce the dielectric strength.

In contrast, as shown in the particular embodiment, if a channel area 103 having an impurity density of about $10^{15}$ cm$^{-3}$ is formed, the channel length L can be shortened to less than 3 μm.

Cbc is further reduced by the channel area 103, and the element separating areas can be also reduced by the shortening of the channel to thereby improve the proportion of an opening. Therefore, the quantity of carriers Qsig stored in the p-base area 4 increases to thereby achieve higher sensitivity.

Figure 4:
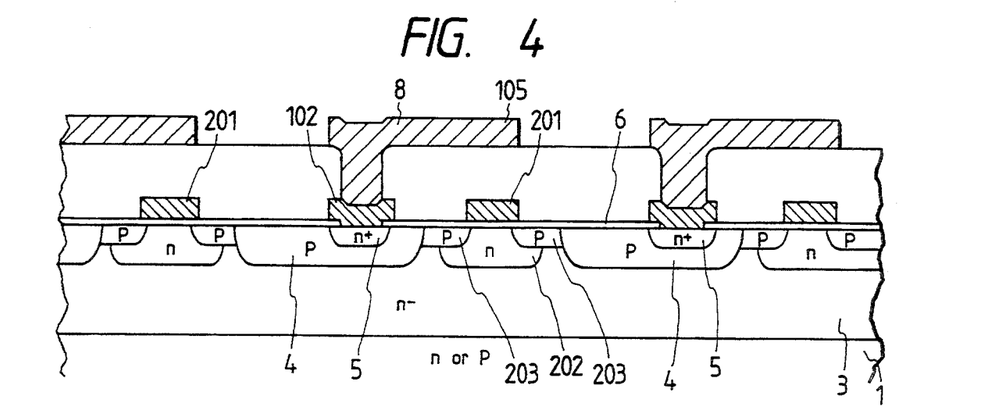
FIGS. 4–7 are schematic cross-section views of a second to a fifth embodiments of the present invention.

FIG. 4 is a schematic cross-section view of a second embodiment of the present invention.

In the particular embodiment, a channel area 202 of higher density than the n$^-$-area 3 is formed between adjacent p-base areas 4 with an oxide film 6 and a gate electrode 201 formed on the channel area 202. Subsequently, by ion implantation or the like, p-areas 203 are formed in a self-aligning manner using the gate electrode 201 as a mask to thereby constitute a PMOS with the p-areas 203 as its source and drain.

By such fabrication, the channel of the PMOS is shortened as in the first embodiment to thereby accelerate the fining of the element separating areas. In the particular embodiment, the channel length L can be shortened to about 1.5 μm.

The p-areas 203 which are the source and drain can be formed shallow, and the impurity density can be set to any desired value to thereby optimize PMOS. Since PMOS is fabricated in a self-aligning manner, the manufacturing process is simplified and reproducibility is improved.

In the particular embodiment, the capacitor electrode which controls the potential of the p-base areas 4 is provided separately from the gate electrode 201.

Figure 5:
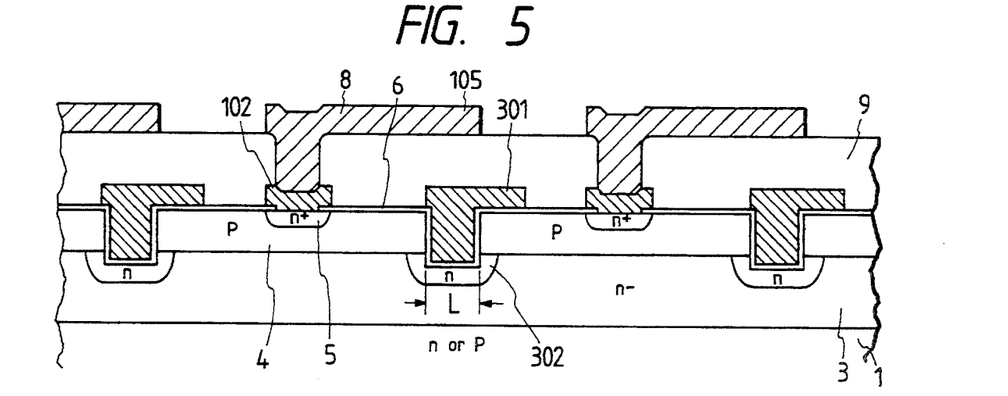

FIG. 5 is a schematic cross-section view of a third embodiment of the present invention.

In the particular embodiment, a groove is formed in each element separating area, a channel area 302 and an oxide film 6 are disposed in the groove and the corresponding electrode 301 is formed therein.

The electrode 301 is the gate electrode of PMOS which has adjacent p-base areas 4 as its source and drain. The electrode 301 is also a capacitor electrode which opposes the corresponding p-base area 4 with an oxide film 6 therebetween.

In the particular embodiment, by the groove forming steps, the element separating areas can be formed with a width less than 1 μm. Nevertheless, the effective channel length is longer than the width L of the groove, as shown, to thereby suppress the short channel effect.

Figure 6:
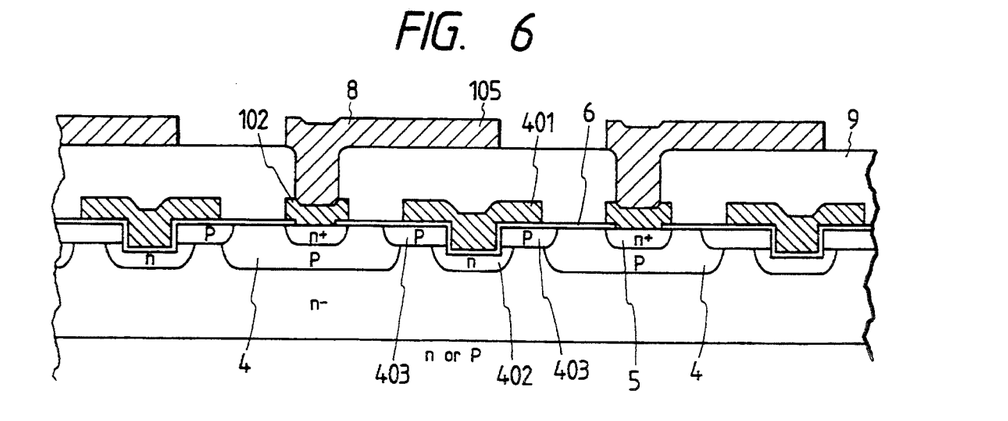

FIG. 6 is a schematic cross-section view of a fourth embodiment of the present invention.

In the embodiment, a channel area 402, and p-areas 403 as the source and drain are formed between adjacent p-areas 4, and an electrode 401 is formed so as to have an oxide film 6 between the electrode 401 and channel area 402 and p-areas 403. The electrode 401 is the gate electrode of PMOS and functions also as a capacitor electrode.

As shown, since the electrode 401 is formed in a groove also in the particular embodiment, advantages similar to those provided by the third embodiment are provided.

Further, in the particular embodiment, the density of p-areas 403 can be set to any desired value separately from that of p-base areas 4. Therefore, by setting the density of p-areas 403 to $10^{18}$ cm$^{-3}$ or more, the value of the capacitor Cox formed by the capacitor electrode 401 can be stabilized.

As described above, a positive voltage is also applied to the capacitor electrode 401 when reading is effected. This causes the potential of p-base areas 4 to increase to thereby cause the storage voltage to be read on the emitter side. In that case, if the density of the opposing p-areas 403 is low, the surface of p-areas 403 is inverted and the effective capacitance Cox' of the capacitor is given by $$\text{Cox} \cdot \text{Cinv}/(\text{Cox} + \text{Cinv})$$

where Cinv is the value of the capacitance in the inverted state.

Therefore, Cox' is smaller than Cox and the read signal is reduced. In order to eliminate such problems, it is desirable to increase the density of p-areas 403 to thereby stabilize Cox.

In the particular embodiment, since the density of p-areas 403 can be set separately from the p-base area, the above problems are solved to thereby improve the sensor characteristic.

Figure 7:
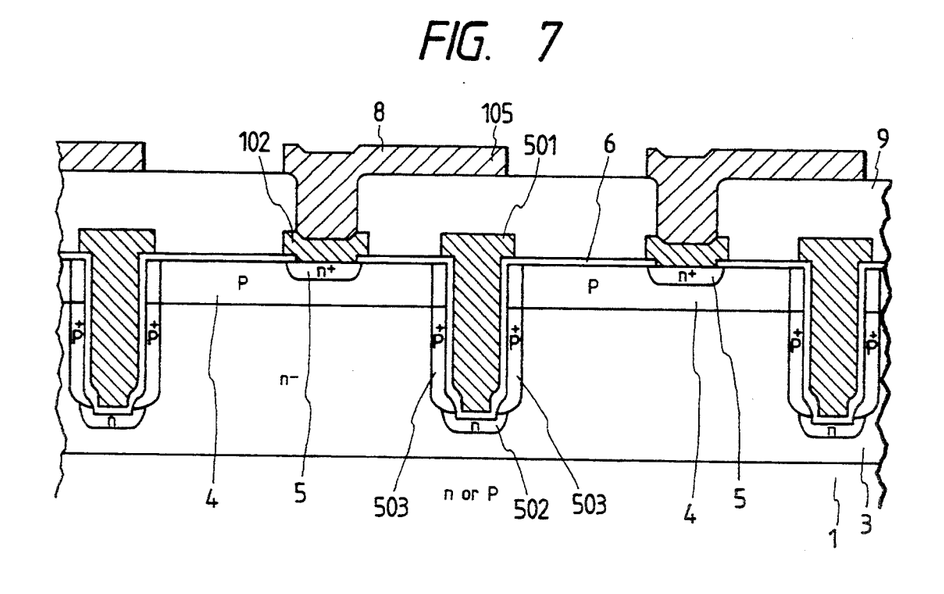

FIG. 7 is a schematic cross-section of a fifth embodiment of the present invention.

In the particular embodiment, a groove in each element separating area is formed deeper than the previous embodiments, PMOS as well as capacitor Cox is formed in the groove.

A channel area 502 is formed on the bottom of the groove, p-areas 503 are formed on the inner side walls of the groove and joined to the adjacent p-base areas 4, and an electrode 501 as the gate electrode of PMOS and as capacitor electrode is embedded in the groove with its head portion spanning adjacent oxide films 6.

By this arrangement, the capacitor electrode is removed from the light receiving surface to thereby improve the proportion of the opening greatly. The capacitance value of Cox can be easily determined by the depth of the groove. Further, as mentioned above, the density of the impurities in the p-areas 503 opposite to electrode 501 can be set separately from those of the p-base area 4, so that the capacitance value of Cox can be stabilized.

As mentioned above in detail, a photoelectric conversion apparatus of each of the present embodiments includes an insulated gate type transistor which in turn includes as the main electrode areas semiconductor areas which store carriers in a photoelectric conversion cell, and a channel area between the main electrode areas, so that if the transistor is placed in an on-state, the respective potentials of the cell semiconductor areas can be set easily at a constant potential irrespective of the quantity of stored carriers. Therefore, the problem of the afterglow is solved and the linearity of the photoelectric conversion characteristic is improved.

If the insulated gate-type transistor is put in an off-state, the respective photoelectric conversion cells can be electrically separated, no formation of element separating areas is required as is the case with the conventional device, the manufacturing process is simplified and the devices become suitable for fining a device.

By determining the density and depth of the channels as in the present invention, the insulated gate type transistor channels can be shortened, the proportion of an opening is improved, the element separating areas are fined, and therefore the sensors are fabricated with high density.

I claim:

1. A photoelectric conversion apparatus comprising:
   a semiconductor area of a first conductivity type;
   a plurality of second semiconductor areas of a second conductivity type formed in a position adjacent to said first semiconductor area of the first conductivity type for storing therein carriers produced by optical excitation; and
   a fourth semiconductor area of the first conductivity type adjacent to said second semiconductor area, wherein said second semiconductor area are arranged between said fourth and first semiconductor areas, and said first, second and fourth semiconductor areas constitute a bipolar transistor,
   wherein adjacent ones of said second semiconductor areas of the second conductivity type adjacent to said first semiconductor area of the first conductivity type are used as main electrode areas, and a portion of a third semiconductor area of the first conductivity type between said adjacent ones of said semiconductor areas of the second conductivity type adjacent to said first semiconductor area of the first conductivity type is used as a channel area, a gate electrode is arranged corresponding to said third semiconductor area, thereby forming an insulated gate type transistor,
   wherein said channel area is formed at least substantially as deep as said adjacent ones of said semiconductor areas of the second conductivity type formed in said semiconductor area of the first conductivity type, and wherein said channel area is formed in a depth substantially identical with a depth of at least adjacent one of said second semiconductor area of the second conductivity type adjacent to said first semiconductor areas of the first conductivity type, said channel area has an impurity concentration higher than said first semiconductor area of the first conductivity type, and lower than the impurity concentrations of any of said second semiconductor areas of the second conductivity type.

2. An apparatus according to claim 1, wherein said channel area is formed in a region including a bottom of a trench portion provided in a region in said semiconductor area of the second conductivity type.

3. An apparatus according to claim 2, wherein said insulated gate type transistor is provided on said trench portion.

4. A photoelectric conversion apparatus according to claim 1, wherein
   said second semiconductor area comprises a first region and a second region provided in a periphery of said first region, and said fourth semiconductor area is adjacent to said second region of said semiconductor area.

5. An apparatus according to claim 4, wherein said channel area is formed in a region including a bottom of a trench portion provided in a region of the one of the semiconductor areas of the second conductivity type and a region of the different one of the semiconductor areas of the second conductivity type.

6. An apparatus according to claim 5, wherein an electrode is provided on said trench portion.

7. An apparatus according to claim 1, wherein said semiconductor of the first conductivity type is an n-type semiconductor.

8. A photoelectric conversion apparatus according to claim 1, wherein said second semiconductor region has a first region and a second region provided in a periphery of said first region, and said fourth semiconductor region is adjacent to said second region of said second semiconductor region.

9. An apparatus according to claim 8, wherein said third semiconductor region is formed at a region including a portion under a trench section provided between said second semiconductor regions.

10. An apparatus according to claim 9, wherein said electrode is provided at said trench section.

11. A photoelectric conversion apparatus comprising:
   a plurality of first semiconductor transistors each having two main electrode regions of a first conductivity type and a control electrode region of a second conductivity type which can store carriers generated by photoexcitation; and
   a second semiconductor transistor having a channel area of the first conductivity type provided between said control electrode region, adjacent each other, and a gate electrode provided correspondingly to said channel region,
   wherein said channel area has an impurity concentration higher than that of said main electrode region adjacent to the channel area, and the channel area has a higher impurity concentration than any adjacent area of said first conductivity type, and at least a part of the channel area is formed at a position in a region adjacent to the control electrode regions at a position deeper than a surface of the apparatus.

12. An apparatus according to claim 11, wherein said impurity concentration of said channel area is lower than that of said main electrode region except in the region of the main electrode adjacent to said channel area.

13. An apparatus according to claim 11, wherein said channel area is provided along a trench portion provided between said pair of control electrode regions.

14. An apparatus according to claim 11 further comprising second conductivity type regions adjacent to said control electrode regions, wherein said channel area is provided along said second conductivity type regions adjacent to said control electrode regions provided along a trench portion between said pair of control electrode regions.

15. An apparatus according to claim 11, further comprising second conductivity type regions adjacent to said control electrode regions wherein said channel area is provided between said second conductivity type regions adjacent to said control electrode regions.

16. An apparatus according to claim 11, wherein said first transistors are arranged in a matrix.

17. An apparatus according to claim 11, wherein said first transistors are arranged in a matrix, and said second transistors are arranged in a column.

18. An apparatus according to claim 11, wherein said second semiconductor transistor is p-channel MOS transistor.

19. A photoelectric conversion apparatus according to claim 11, wherein said second semiconductor region has a first region and a second region provided in a periphery of said first region.

20. A photoelectric conversion apparatus comprising:
a first semiconductor area of a first conductivity type;
a plurality of second semiconductor areas of a second conductivity type in said first semiconductor area for storing carriers generated by optical excitation of said first semiconductor area;
a third semiconductor area, of the first conductivity type adjacent to and provided between said second semiconductor areas, said third semiconductor area having an impurity concentration higher than that of said first semiconductor area, and said third semiconductor area having a higher impurity concentration than any adjacent area containing said first conductivity type;
a fourth semiconductor area, of the first conductivity type, disposed adjacent to said second semiconductor areas;
an electrode disposed in proximity to the channel area between the neighboring ones of said second semiconductor areas; and
an insulating layer between said electrode and said channel area of the third semiconductor area,
wherein said first, second and fourth semiconductor areas define a photoelectric conversion cell, and
wherein one of said neighboring ones of said second semiconductor areas, said channel area of said third semiconductor area, and said electrode disposed in proximity to the channel area define an insulated gate type transistor.

21. A photoelectric conversion apparatus according to claim 20, wherein said third semiconductor area has a depth at least equal to that of said second semiconductor areas.

22. A photoelectric conversion apparatus according claim 20, wherein said third semiconductor area has a impurity concentration higher than that of said first semiconductor area, and lower than that of said second semiconductor areas.

23. A photoelectric conversion apparatus according to claim 20, wherein said third semiconductor area includes a bottom of a trench which is provided between said neighboring second semiconductor areas.

24. A photoelectric conversion apparatus according claim 23, wherein said insulated gate type transistor is provided at said trench.

25. A photoelectric conversion apparatus according claim 20, further comprising a fifth semiconductor area, of the second conductivity type, wherein said third semiconductor area is adjacent to said fifth semiconductor area and wherein said fifth semiconductor area is adjacent to said second semiconductor area.

26. A photoelectric conversion apparatus according claim 25, wherein said third semiconductor area is provided at an area including a bottom of a trench provided between at least said neighboring second semiconductor areas.

27. A photoelectric conversion apparatus according claim 26, wherein said electrode is provided at said trench.

28. A photoelectric conversion apparatus according to claim 20, wherein the first conductivity type is n-type.

29. A photoelectric conversion apparatus according to claim 20, wherein the second conductivity type is p-type.

30. A photoelectric conversion apparatus comprising:
a first semiconductor region of a first conductivity type;
a plurality of second semiconductor regions of a second conductivity type for accumulating carriers generated by photoexcitation within said first semiconductor region;
a third semiconductor region of the first conductivity type serving as a channel region provided between said second semiconductor regions, said third semiconductor region having an impurity concentration higher than that of said first semiconductor region and any other adjacent region having a first conductivity type;
a fourth semiconductor region of the first conductivity type provided in contact with said second semiconductor region; and
an electrode provided correspondingly to said third semiconductor region for controlling a potential of said third semiconductor region, wherein said first, second and fourth semiconductor regions constitute a photoelectric conversion cell.

31. An apparatus according to claim 30, wherein the depth of said third semiconductor region is the same as or greater than the depth of said second semiconductor region.

32. An apparatus according to claim 30, wherein an impurity concentration of said third semiconductor region is higher than that of said first semiconductor region, and is lower than that of said second semiconductor region.

33. An apparatus according to claim 30, wherein said third semiconductor region is formed at a region including a portion under a trench section between said second semiconductor regions.

34. An apparatus according to claim 33, wherein at the-trench section, an insulated gate transistor is formed.

35. An apparatus according to claim 30, wherein said first conductivity type is n-type.

36. An apparatus according to claim 30, wherein said second conductivity type is p-type.

* * * * *

UNITED STATES PATENT AND TRADEMARK OFFICE
CERTIFICATE OF CORRECTION

PATENT NO. : 5,412,243

DATED : May 2, 1995

INVENTOR(S) : MASAKAZU MORISHITA

It is certified that error appears in the above-identified patent and that said Letters Patent is hereby corrected as shown below:

COLUMN 1

Line 28, "like" should read --like.--.

COLUMN 2

Line 67, "plurality" should read --a plurality--.

COLUMN 3

Line 5, "transistor" should read --transistor having--.
   Line 20, "NO." should read --No.--.
   Line 64, "as," should read --As,--.
   Line 67, "$n^+$-area 3" should read --$n^-$-area 3--.

COLUMN 4

Line 17, "FIG. 2B" should read --FIG. 2B,--.

COLUMN 7

Line 47, "area" should read --areas--.

COLUMN 9

Line 7, "claim 11" should read --claim 11,--.
   Line 25, "is" should read --is a--.
   Line 64, "according" should read --according to--.
   Line 65, "a" should read --an--.

UNITED STATES PATENT AND TRADEMARK OFFICE
CERTIFICATE OF CORRECTION

PATENT NO. : 5,412,243
DATED : May 2, 1995
INVENTOR(S) : MASAKAZU MORISHITA

It is certified that error appears in the above-identified patent and that said Letters Patent is hereby corrected as shown below:

COLUMN 10

Line 5, "according" should read --according to--.
Line 8, "according" should read --according to--.
Line 14, "according" should read --according to--.
Line 19, "according" should read --according to--.
Line 62, "the-trench" should read --the trench--.

Signed and Sealed this

Twenty-second Day of August, 1995

Attest:

BRUCE LEHMAN

Attesting Officer     Commissioner of Patents and Trademarks